US008354689B2

(12) United States Patent
Chua et al.

(10) Patent No.: US 8,354,689 B2
(45) Date of Patent: Jan. 15, 2013

(54) LIGHT EMITTING DEVICES HAVING DOPANT FRONT LOADED TUNNEL BARRIER LAYERS

(75) Inventors: Christopher L. Chua, San Jose, CA (US); Zhihong Yang, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 99 days.

(21) Appl. No.: 13/097,001

(22) Filed: Apr. 28, 2011

(65) Prior Publication Data

US 2012/0273750 A1 Nov. 1, 2012

(51) Int. Cl.
*H01L 21/00* (2006.01)
*H01L 33/06* (2010.01)
*H01L 33/14* (2010.01)
*H01L 33/32* (2010.01)

(52) U.S. Cl. .......... 257/101; 438/37; 257/E33.026; 257/E33.028; 257/E33.029; 257/E33.031; 257/E33.032; 257/E33.034

(58) Field of Classification Search .......... 257/13, 257/30, 101, 102, 103, E33.026, E33.028, 257/E33.029, E33.031, E33.032; 438/37, 438/46, 47
See application file for complete search history.

(56) References Cited

U.S. PATENT DOCUMENTS

| 6,816,528 | B1 | 11/2004 | Kneissl et al. |
| 7,282,744 | B2* | 10/2007 | Flynn et al. ............ 257/94 |
| 7,638,792 | B2 | 12/2009 | Suzuki |
| 7,872,272 | B2* | 1/2011 | Bour et al. ............ 257/98 |
| 7,919,791 | B2* | 4/2011 | Flynn et al. ............ 257/194 |
| 2004/0184497 | A1 | 9/2004 | Kneissl et al. |
| 2005/0056210 | A1 | 3/2005 | El-Zein et al. |
| 2011/0001145 | A1 | 1/2011 | Park |

OTHER PUBLICATIONS

Krishnamoorthy et al., "Polarization-engineered GaN/InGaN/GaN tunnel diodes", Applied Physics Letters, vol. 97 (20), 2010, 11 pages.
Zhang et al., "GaAs-based multiple quantum well tunneling injection lasers", Applied Physics Letters, vol. 69 (16), 1996, 3 pages.

\* cited by examiner

*Primary Examiner* — Evan Pert
(74) *Attorney, Agent, or Firm* — Hollingsworth Davis, LLC

(57) ABSTRACT

Light emitting devices described herein include dopant front loaded tunnel barrier layers (TBLs). A front loaded TBL includes a first surface closer to the active region of the light emitting device and a second surface farther from the active region. The dopant concentration in the TBL is higher near the first surface of the TBL when compared to the dopant concentration near the second surface of the TBL. The front loaded region near the first surface of the TBL is formed during fabrication of the device by pausing the growth of the light emitting device before the TBL is formed and flowing dopant into the reaction chamber. After the dopant flows in the reaction chamber during the pause, the TBL is grown.

22 Claims, 6 Drawing Sheets

LIGHT EMITTING DEVICES HAVING DOPANT FRONT LOADED TUNNEL BARRIER LAYERS

STATEMENT REGARDING FEDERALLY SPONSORED RESEARCH AND DEVELOPMENT

This invention was made with Government support under W911NF-08-2-0031 awarded by the U.S. Army. The Government has certain rights in this invention.

SUMMARY

Embodiments described in the disclosure involve light emitting devices and methods for making light emitting devices that include dopant front loaded tunnel barrier layers (TBLs). Some embodiments involve methods for forming light emitting devices having front loaded TBLs. The various layers of a light emitting device can be grown in a reaction chamber. A dopant flows into the reaction chamber during a pause in which no growth of the device occurs. The pause occurs after deposition of a previously grown layer and before deposition of a TBL doped with the dopant. After the pause, growth of the TBL is initiated. In some embodiments, the previously grown layer comprises a layer of an active region of the device. In some embodiments, the previously grown layer is an active light emitting layer of the device. For example, the active layer light emitting layer may be a layer of a double heterostructure or a quantum well.

In some implementations, flowing the dopant into the reaction chamber includes decreasing a first injection gas used during deposition of the active layer and replacing the first injection gas with a second injection gas and a gas containing the dopant. In some cases, the decreasing and replacing of the gases occurs gradually in a series of steps.

In some implementations the first injection gas comprises $N_2$ and the second injection gas comprises $H_2$. In some cases, the series of steps involves decreasing the first injection gas and replacing the first injection gas with the second injection gas occurs during the pause. In some cases, the series of steps occurs after the pause.

Some embodiments involve a semiconductor light emitting device that includes an active region comprising one or more light emitting layers. The light emitting device can be a light emitting diode, a laser diode, or a superluminescent diode, for example. The light emitting device includes a tunnel barrier layer (TBL) having a first surface closer to the active region and a second surface farther from the active region. The dopant concentration of the tunnel barrier layer is higher at the first surface than at the second surface. The active region may include one or more active light emitting layers. The one or more active light emitting layers may comprise a light emitting layer of a double heterostructure, or one or more quantum wells. In some cases, the light emitting layers of the active region may comprise AlGaN and the dopant may be Mg. In some configurations, the light emitting layers may emit light in a characteristic wavelength range having a peak wavelength of less than about 300 nm.

In some embodiments, a first grown region of the dopant front loaded tunnel barrier layer has a dopant concentration that is equal to or greater than a concentration of dopant elsewhere in the tunnel barrier layer. In some implementations, the first grown region which is dopant front loaded includes about 2% of a thickness of the tunnel barrier layer. In some implementations, the dopant concentration of the first grown region is at least about 50% higher on average than a dopant concentration elsewhere in the tunnel barrier layer.

The light output of the light emitting device that includes the dopant front loaded tunnel barrier layer is higher than the light output of a substantially similar device that does not include a dopant front loaded tunnel barrier layer.

The above summary is not intended to describe each embodiment or every implementation. A more complete understanding will become apparent and appreciated by referring to the following detailed description and claims in conjunction with the accompanying drawings.

DESCRIPTION OF VARIOUS EMBODIMENTS

Light emitting devices, e.g., light emitting diodes, laser diodes, and superluminescent diodes may use a tunnel barrier layer (TBL) to help contain electrons within the active region. For example, the light emitting devices using a TBL can be based on InGaN and/or AlGaN material systems, The TBL layer may be highly doped and thin to allow holes to tunnel through the TBL into the active region of the device while blocking electrons from overshooting the active region. Effectively doping the TBL can present heterostructure fabrication challenges because of the inherent properties of the thin and high bandgap material of the TBL. These challenges can be particularly significant at the initial stages of TBL growth.

Embodiments described in this disclosure involve methods of making a TBL having a dopant gradient wherein the TBL surface initially grown is front loaded with dopant. Some embodiments include light emitting devices that have a front loaded TBL. Front loading the TBL with dopant serves to prevent doping gradients that start out with a low concentration of dopant at the initially grown TBL surface. The TBL may be positioned at a location between the active region and the p-cladding of a light emitting device.

Figure 1:
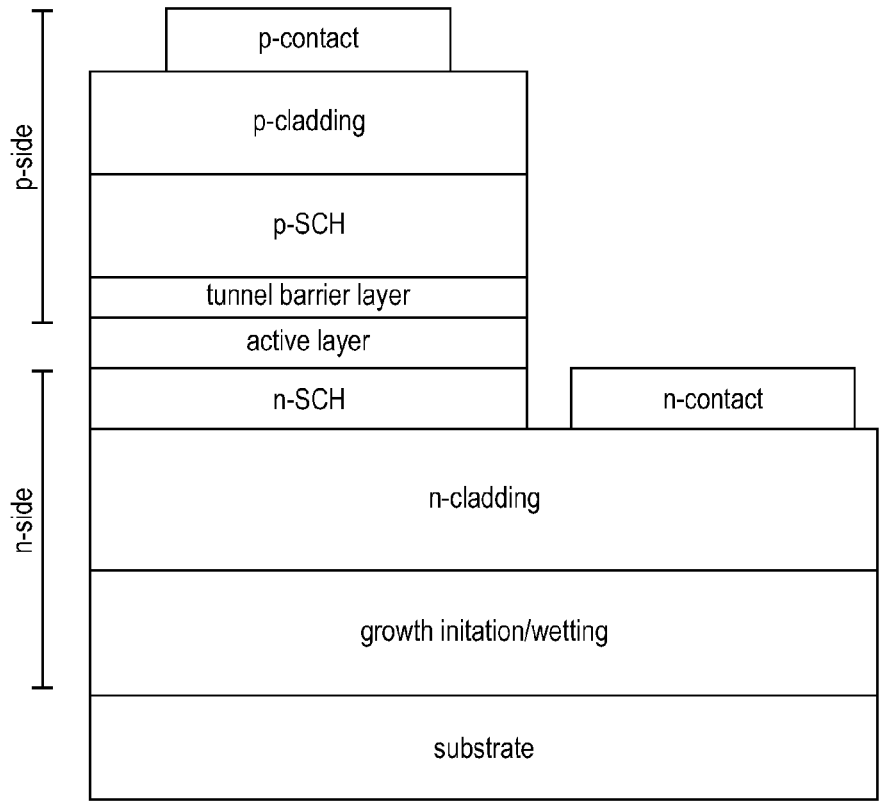
FIG. 1 is a schematic diagram of a light emitting device that may be configured to include at least one front-loaded tunnel barrier layer.

FIG. 1 illustrates a schematic cross section of a light emitting device that incorporates a front loaded TBL. For example, the light emitting device of FIG. 1 may be a light emitting diode, a laser diode, or a superluminescent diode. The device illustrated in FIG. 1 is formed on a substrate, e.g.

sapphire, and may include a series of surface conditioning and/or defect reduction layers disposed on the substrate to facilitate fabrication of the device. For example, as depicted in FIG. 1, the growth initiation layer may comprise an AlN template and the n-cladding layer may include a superlattice structure. The active region of the device includes an active layer that emits light and is arranged between p-side and n-side separate confinement heterostructures (SCHs). As illustrated in FIG. 1, the TBL may be disposed between the active region and the p-side SCH.

The active region of a light emitting device can include multiple layers, at least one of which is a light emitting layer. For example, in some cases, the active region of a light emitting device may comprise a double heterostructure (DH) having one or more light emitting layers. As another example, the active region may comprise a quantum well structure that includes one or more quantum wells separated by barrier layers. In such a structure, the quantum wells are the light emitting layers. As referred to herein, the term "active layer" is used to identify one or more light emitting layers of an active region.

Figure 2:
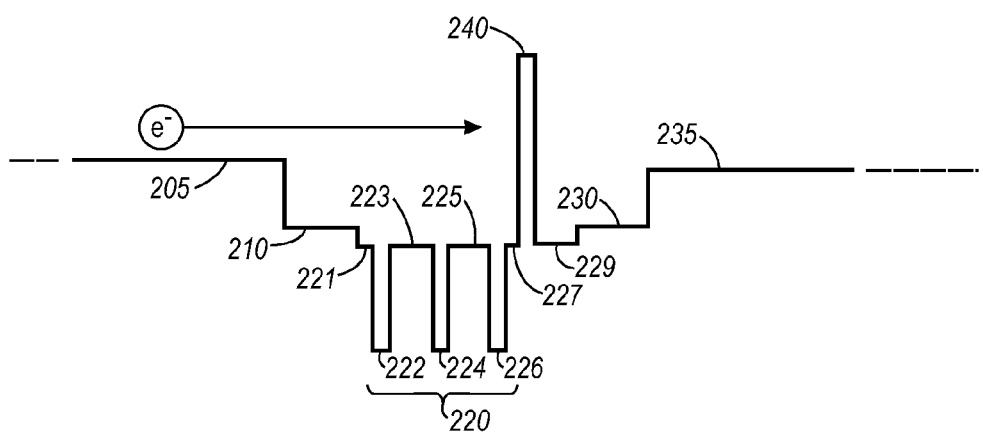
FIG. 2 is a conduction band energy diagram for the light emitting device of FIG. 1.

FIG. 2 is a conduction band energy diagram for the light emitting device of FIG. 1. The conduction band energy levels are shown for several portions of the light emitting device. FIG. 2 shows the energy level 205 associated with the n-cladding region, the energy level 210 associated with the n-side SCH, the energy level 230 associated with the p-side SCH, and the energy level 235 associated with the p-cladding region. In this example, the active region 220 includes three quantum wells that are separated by barriers. The energy levels 222, 224, 226 of the three quantum wells and the energy levels of the four barriers 221, 223, 225, 227 are illustrated in FIG. 2. The energy level of a fifth barrier 229 is also shown. The relatively high energy level of the TBL 240 helps prevent electrodes from escaping the active region. However, the energy level of the TBL may vary in different devices. For example, in various configurations, the energy level of the TBL may be greater than or about equal to the energy level of the p-side SCH.

In FIG. 2, the position of the TBL is between the fourth and fifth barriers. The position of the TBL can be identified with reference to the position of the energy levels of the fourth and fifth barriers 227, 229 and the position of the energy level of the TBL 240. In various embodiments, the TBL may be positioned at various locations between the active region and the p-SCH. For example, as depicted in FIG. 2, the TBL may be positioned between the fourth and fifth barriers. In another example, there may be no fifth barrier and the TBL could be positioned between the last barrier of the quantum well structure and the p-SCH. Note that the thicknesses of the fourth and fifth barriers shown in FIG. 2 may vary from zero to some finite thickness. In FIG. 2, the thicknesses of the fourth and fifth barriers have finite values. However, in other implementations, the thickness of one or both of the fourth and fifth barriers may be zero. If the thickness of the fourth barrier is zero, for example, the TBL can be positioned just after the last quantum well. If the thickness of the fifth barrier is zero, the TBL is positioned just before the p-SCH.

As depicted in FIG. 2, electrons entering the active region from the n-SCH must have an energy that exceeds the TBL energy level 240 to overshoot the active region. The TBL is heavily p doped and thin, e.g. about 20 nm, to allow holes from the p-SCH to tunnel through the TBL and to enter the active region 220 where the holes can combine with the electrodes and thus produce light emission. As previously discussed, the position of the TBL can be varied from immediately after the last quantum well to immediately before the p-SCH, depending on the intended device. For example, for lasers, the TBL may be positioned for optimal optical mode confinement factor. For light emitting diodes, the TBL may be positioned for minimal electron leakage.

Figure 3:
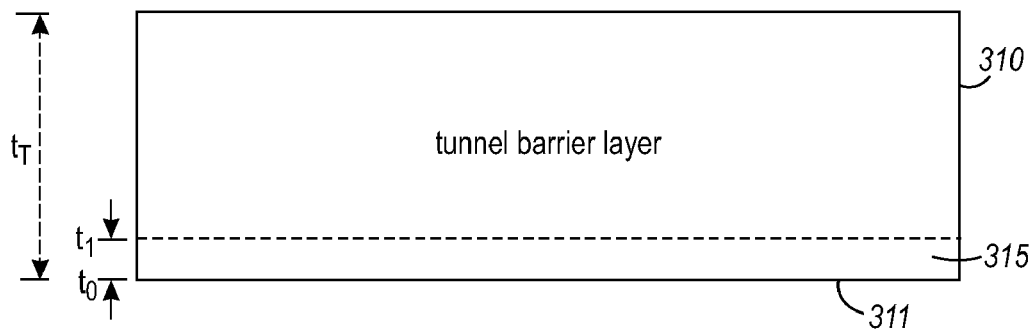
FIG. 3 is a view of the tunnel barrier layer including a front-loaded region.

FIG. 3 is another view of the TBL 310. In some embodiments, the concentration of the dopant is different at different thicknesses of the TBL 310. According to some implementations, a higher concentration of the dopant exists within in a region 315 of the TBL that is the first to be grown. FIG. 3 illustrates the TBL 310 having a region 315 which is front-loaded with the dopant and which incorporates the first grown surface 311. The TBL has a total thickness, $t_T$. The region 315 comprises a first grown portion of the TBL from $t_0$ to $t_1$. For example, $t_0$ may start at the front loaded surface 311 and $t_1$ may extend into the TBL up to about 2%, 5%, 10%, 25% or even 50% of the total thickness, $t_T$. In implementations in which the active layer is grown before the TBL, the concentration of dopant in the front loaded region 315 at the interface between the active layer and the TBL is equal to or greater than the concentration of dopant in a region farther from the TBL surface at the active layer/TBL interface. In some implementations, the front loaded region 315 has a dopant concentration of about 1.5 times to about 100 times more dopant than the dopant concentration at other locations within the TBL. For example, the front loaded region 315 may have a a dopant concentration of about 1.5 times, 2 times, 5 times, 10 times, or even 100 times more dopant than the dopant concentration at other locations within the TBL.

Figure 4:
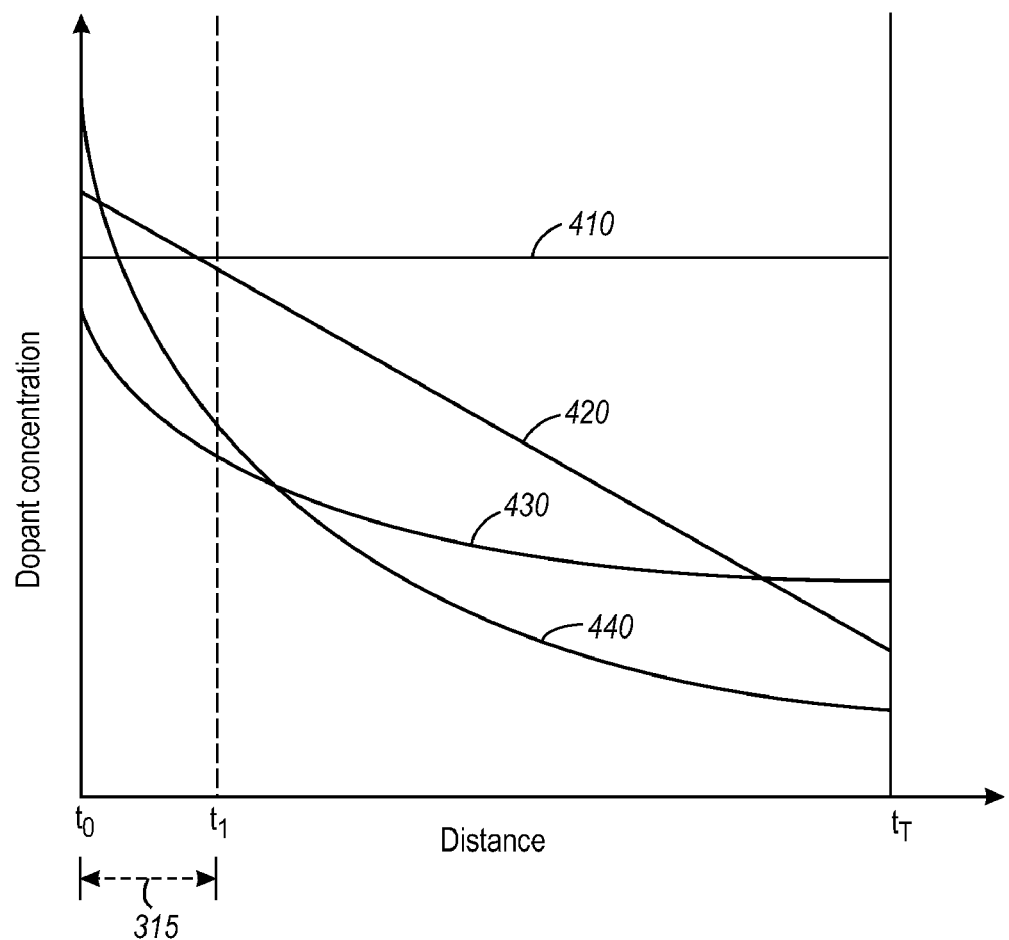
FIG. 4 illustrates several examples of possible doping gradients of the tunnel barrier layer.

Devices described in this disclosure may have different doping gradients within the TBL. FIG. 4 illustrates several examples of possible doping gradients in accordance with embodiments described in this disclosure. As described previously, the concentration of dopant within the front loaded region 315 at or near the first grown TBL surface is equal to or greater than the concentration of dopant in a later grown region. In the example of doping gradient 410, the doping concentration remains substantially constant in all regions of the TBL. Another doping gradient example 420 illustrates a high doping gradient at the beginning of TBL growth that decreases linearly throughout the TBL. Doping gradient 430 shows yet another example in which the dopant concentration is highest at the beginning of the growth of the TBL and then non-linearly decreases throughout the growth of the TBL. As a final example, in doping gradient 440 the concentration of the dopant is highest at the beginning of the growth of the TBL and then decreases non-linearly at a higher rate than gradient 430.

Figure 5:
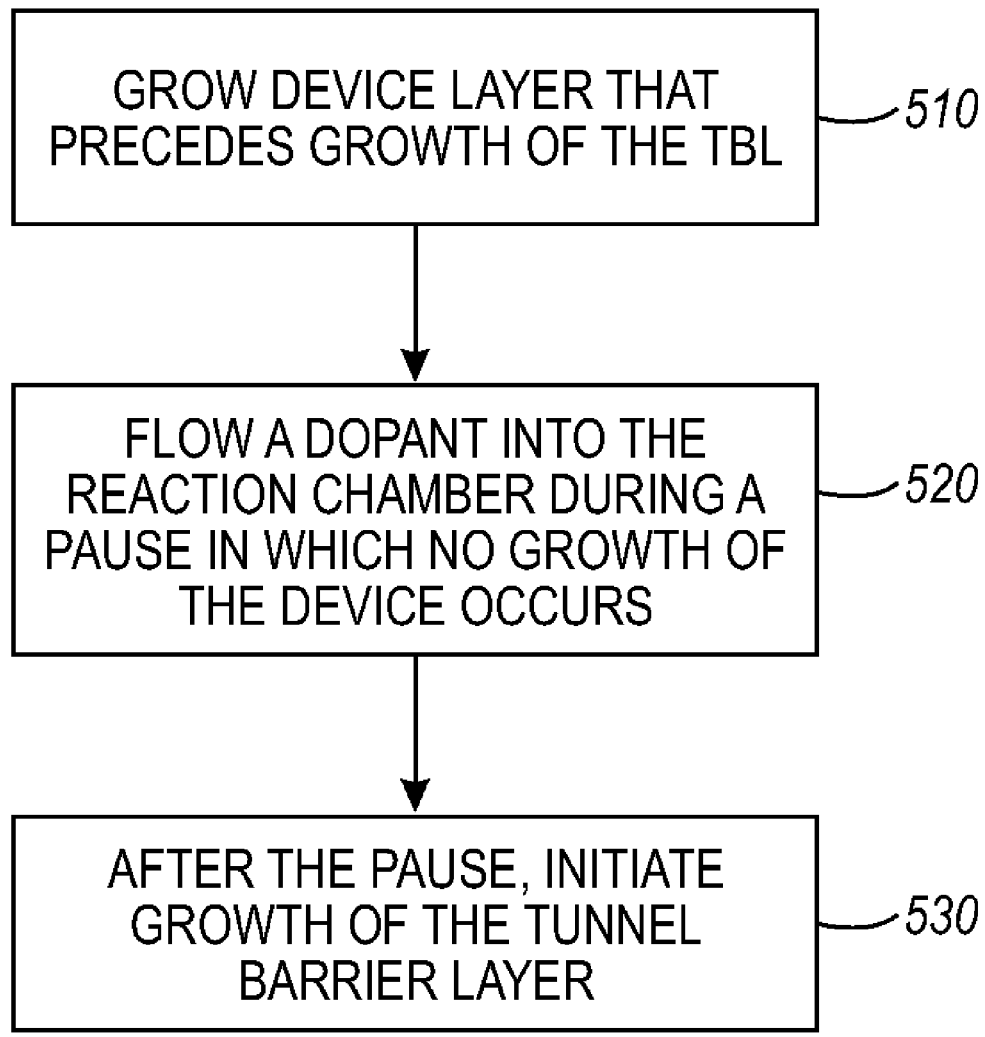
FIG. 5 is a flow diagram that illustrates a process for making light emitting devices that comprise a front loaded tunnel barrier layer in accordance with embodiments described in this disclosure.

FIG. 5 is a flow diagram that illustrates a process for making light emitting devices having a front loaded TBL as described above. A multi-layer device that includes an active light emitting layer is grown in a reaction chamber, e.g., by metal-organic chemical vapor deposition (MOCVD) or by molecular beam epitaxy (MBE). The device includes a doped TBL near the active layer. The layer that is grown just before the TBL is grown, referred to below as the preceding layer, may be the active layer or may be a layer of the p-SCH. After the preceding layer is grown 510, the TBL dopant is flowed 520 into the reaction chamber during a pause in which no growth of the device occurs. Growth 530 of the TBL is initiated after the pause. For a p-doped TBL, the dopant flowed to the reaction chamber may comprise Mg and/or other p-type dopants.

Figure 6:
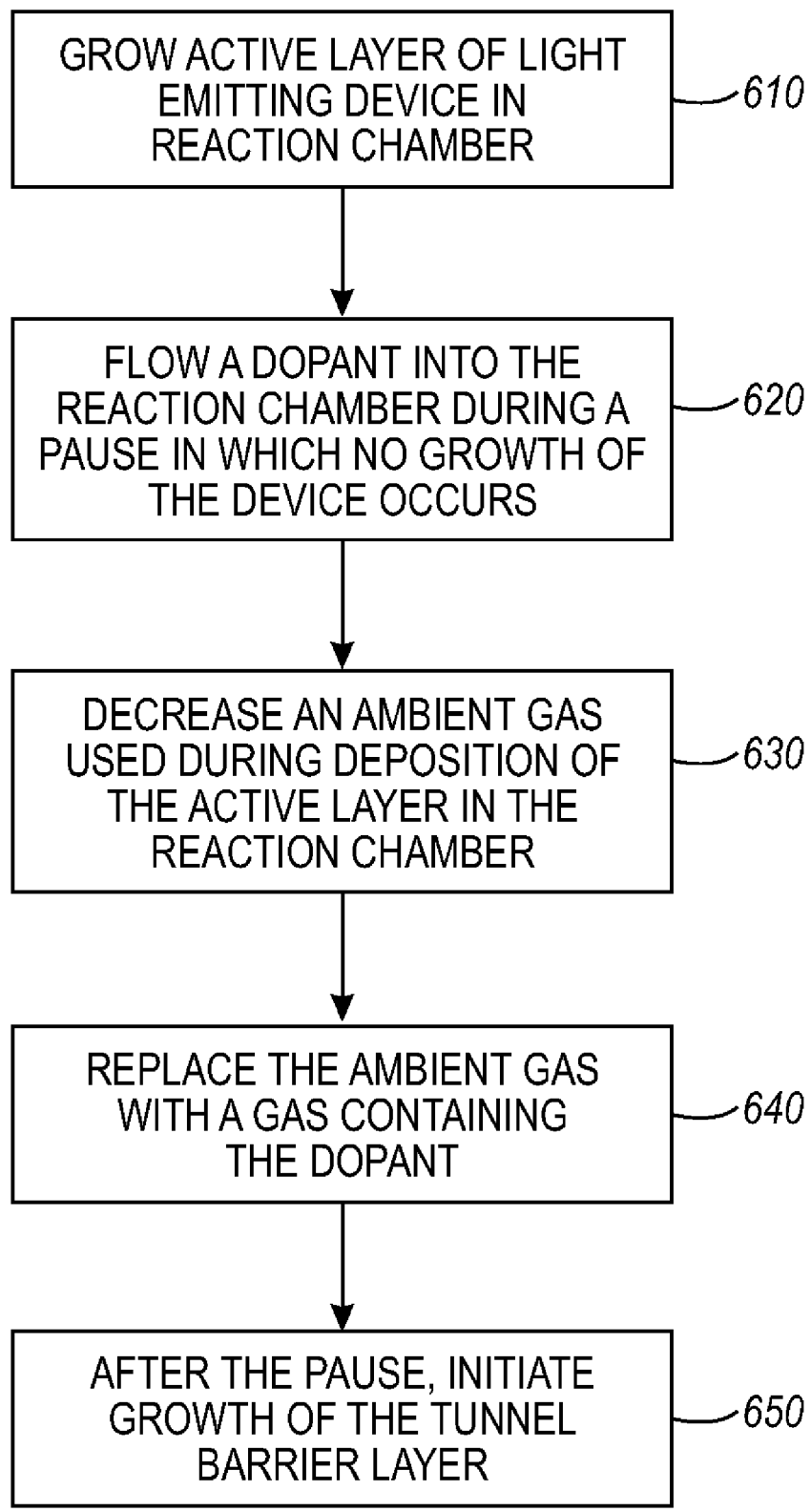
FIG. 6 is a more detailed flow diagram for making light emitting devices that include a front loaded tunnel barrier layer.

FIG. 6 is a more detailed flow diagram in accordance with implementations described in this disclosure. As in the flow diagram of FIG. 5, a device having an active light emitting layer is grown in a reaction chamber. After the active layer is grown 610, a dopant is flowed 620 into the reaction chamber during a pause in which no growth of the device occurs. In this implementation, the pause occurs after deposition of the active layer and before deposition of the TBL. An injection gas, e.g., $N_2$, which is used during deposition of the active layer is decreased 630 in the reaction chamber and is replaced 640 with another injection gas, e.g., $H_2$, along with a gas containing the dopant. After the pause, the growth of the TBL is initiated 650.

In some cases, different carrier gasses for different portions of the device may be used to enhance crystal quality. In some implementations, the quantum wells are grown at a slow growth rate and under high pressure in a nitrogen environment. Hydrogen is a highly reducing element, so, in some embodiments, a hydrogen carrier gas is used to reduce impurities when performing the dopant front loading process, and when growing the TBL and other portions of the device structure.

In some implementations, decreasing the injection gas in the reaction chamber and replacing the injection gas with different injection gas along with a gas containing the dopant occurs gradually and/or in one or a series of steps. In some cases additional deposition parameters such as temperature and/or other deposition parameters are also changed during the pause so that the active layer and the TBL are grown at different temperatures, in different gas ambients, and/or are otherwise subjected to different deposition conditions. Parameters may be selected to enhance material quality and device performance. In some implementations, the addition of the dopant begins during the pause in which no growth of the device occurs. In some embodiments, the process involves flowing dopant into the reaction chamber so that the amount or concentration of dopant reaches a predetermined target level during or after the pause.

EXAMPLE

Light emitting devices were fabricated using the growth conditions illustrated in Table 1. Table 1 shows the growth of the final quantum well structure of an active layer and a TBL. Fabrication of the first barrier of the final quantum well of the active layer includes deposition of $Al_{0.47}Ga_{0.53}N$. During growth of the first barrier, trimethylgalluim (TMG) is flowed in the reaction chamber at a rate of 0.5 standard cubic centimeters per minute (sccm); trimethylaluminum (TMA) is flowed at a rate of 3 sccm, and the injection gas is $N_2$ flowed at a rate of 2000 sccm. Fabrication of the final quantum well includes the deposition of $Al_{0.44}Ga_{0.53}N$. During the growth of the final quantum well, TMG is again flowed to the reaction chamber at a rate of 0.5 sccm, TMA is flowed at a rate of 2.3 sccm, and $N_2$ is flowed at a rate of 2000 sccm. The growth of the second barrier also includes deposition of $Al_{0.47}Ga_{0.53}N$. During the growth of the second barrier TMG is flowed in the reaction chamber at a rate of 0.5 standard cubic centimeters per minute (sccm); trimethylaluminum (TMA) is flowed at a rate of 3 sccm, and the injection gas is $N_2$ flowed at a rate of 2000 sccm.

The gas switch steps in Table 1 correspond to a pause in the growth of the device after the growth of the active layer and immediately before the growth of the TBL. In the gas switch steps, the injection gas is switched from $N_2$ to $H_2$. As can be observed from the table, in the first gas switch step, the injection rate of $N_2$ is moved towards 0 while the injection rate of $H_2$ is moved towards 3000 sccm. In the second gas switch step, the injection rate of the $H_2$ is increased to 4000 sccm and the gas containing the p-dopant, bis-cyclopentadienylmagnesium ($Cp_2Mg$), is introduced to the reaction chamber at a rate of 150 sccm. After the pause, the TBL is grown. The growth of the TBL includes the deposition of $Al_{0.68}Ga_{0.32}N$. During the growth of the TBL, TMG is flowed to the reaction chamber at a rate of 1 sccm and TMA is flowed at a rate of 30 sccm. The gas containing the dopant, $CP_2Mg$, is again flowed at a rate of 150 sccm.

TABLE 1

Processing steps used for the growth of a front loaded TBL

| Step | Material | TMG (sccm) | TMA (sccm) | $CP_2Mg$ | Inject Gas (sccm) |
|---|---|---|---|---|---|
| Barrier | $Al_{0.47}Ga_{0.53}N$ | 0.5 | 3 | 0 | $N_2$ = 2000 |
| Quantum Well | $Al_{0.44}Ga_{0.53}N$ | 0.5 | 2.3 | 0 | $N_2$ = 2000 |
| Barrier | $Al_{0.47}Ga_{0.53}N$ | 0.5 | 3 | 0 | $N_2$ = 2000 |
| Gas Switch | | | | 0 | $N_2 \rightarrow 0$, $H_2 \rightarrow 3000$ |
| Gas Switch | | | | 150 | $N_2 \rightarrow 0$, $H_2 \rightarrow 4000$ |
| TBL | $Al_{0.68}Ga_{0.32N}$ | 1 | 30 | 150 | |

Figure 7:
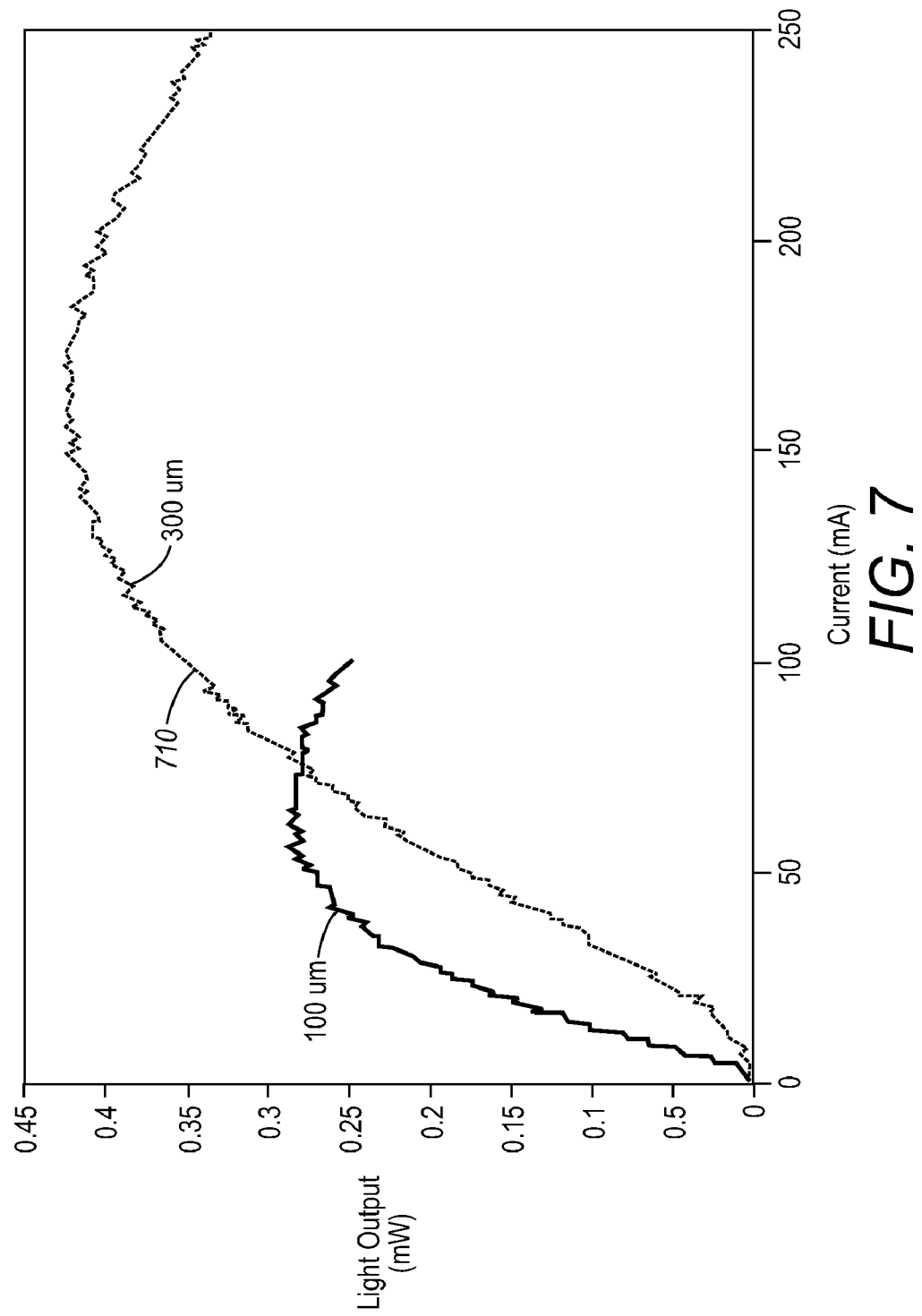
FIG. 7 graphically illustrates light output as a function of current for a 300 μm×300 μm sample light emitting device and a 100 μm×100 μm sample light emitting device for devices without a front loaded tunnel barrier layer.
Figure 8:
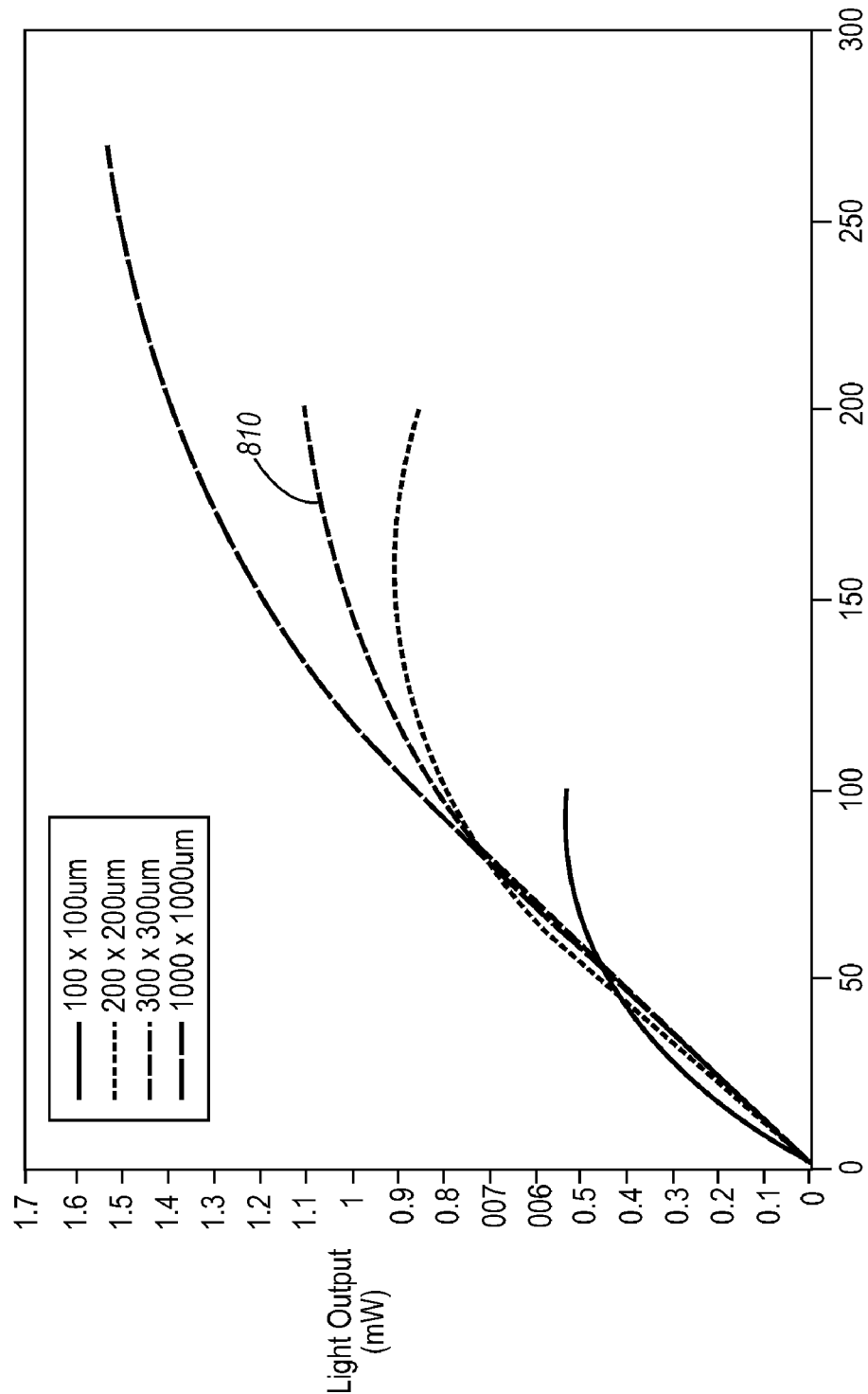
FIG. 8 graphically illustrates light output as a function of current for light emitting devices of various sizes including a 300 μm×300 μm sample light emitting device and a 100 μm×100 μm sample light emitting device for devices with a front loaded tunnel barrier layer.

FIG. 7 and FIG. 8 allow comparison between a light emitting device that includes a front loaded TBL with a light emitting device that has a substantially similar structure except without a front loaded TBL. FIG. 7 shows the light output in mW as a function of current for 100 μm×100 μm and 300 μm×300 μm light emitting devices without front-loaded TBLs. FIG. 8 illustrates the light output for light emitting devices of various sizes (100 μm×100 μm, 200 μm×200 μm, 300 μm×300 μm, and 300 μm×1000 μm) having front-loaded TBLs. As can be observed from graphs 710 and 810 of FIGS. 7 and 8, respectively, the light output of devices with front loaded TBLs is higher than the light output of substantially similar devices of comparable size without front-loaded TBLs. The light output of the 300 μm×300 μm device that does not include a front loaded TBL at 150 mA is about 0.42 mW (see, graph 710, FIG. 7). In contrast, the light output for the 300 μm×300 μm device that includes a front loaded TBL at 150 MA is about 1.2 mW (see, graph 810, FIG. 8).

Systems, devices or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the following detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims. The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

What is claimed is:

1. A method of making a light emitting device, comprising:
   growing a layer of the light emitting device in a reaction chamber;

flowing a dopant into the reaction chamber during a pause in which no growth of the device occurs, the pause occurring after deposition of the layer and before deposition of a tunnel barrier layer doped with the dopant; and after the pause, initiating growth of the tunnel barrier layer.

2. The method of claim 1, wherein the layer comprises a light emitting layer of an active region of the device.

3. The method of claim 2, wherein the active region comprises multiple quantum wells and barriers.

4. The method of claim 1, wherein flowing the dopant into the reaction chamber comprises:

decreasing a first injection gas used during deposition of the active layer in the reaction chamber; and replacing the first injection gas with a second injection gas and a gas containing the dopant, wherein the decreasing and replacing occurs gradually in a series of steps.

5. The method of claim 4, wherein the first injection gas comprises $N_2$ and the second injection gas comprises $H_2$.

6. The method of claim 4, wherein the series of steps occur during the pause.

7. The method of claim 4, wherein the series of steps occur after the pause.

8. The method of claim 1, further comprising modifying one or more additional deposition parameters during the pause.

9. The method of claim 8, wherein the one or more additional parameters includes temperature in the reaction chamber.

10. The method of claim 1, wherein the layer is part of an active region of the device, and the active region is configured to emit light at a wavelength less than about 300 nm.

11. The method of claim 10, wherein the active light emitting layer comprises AlGaN.

12. A method of making a light emitting device, comprising:

growing an active region of the light emitting device in a reaction chamber, the active region comprising at least one AlGaN light emitting layer;

after growing the active region, pausing growth of the light emitting device;

during the pause:

decreasing a first injection gas used during growth of the active layer;

increasing a second injection gas; and flowing a dopant into the reaction chamber; and after the pause, initiating growth of an AlGaN tunnel barrier layer.

13. The method of claim 12, wherein decreasing the first injection gas, increasing the second injection gas, and flowing the dopant is accomplished in a series of discrete steps.

14. A semiconductor light emitting device comprising:

an active region comprising one or more light emitting layers; and a tunnel barrier layer having a first surface closer to the active region and a second surface farther from the active region, the tunnel barrier layer having a dopant concentration that is higher at the first surface than at the second surface.

15. The device of claim 14, wherein the one or more light emitting layers comprises multiple quantum wells.

16. The device of claim 14, wherein the active region comprises AlGaN and the dopant comprises Mg.

17. The device of claim 14, wherein the tunnel barrier layer comprises a first grown region that has a dopant concentration that is equal to or greater than a concentration of dopant elsewhere in the tunnel barrier layer.

18. The device of claim 17, wherein the first grown region includes about 2% of a thickness of the tunnel barrier layer.

19. The device of claim 18, wherein the dopant concentration of the first grown region is at least about 50% higher on average than a dopant concentration elsewhere in the tunnel barrier layer.

20. The device of claim 14, wherein the one or more light emitting layers of the device emit light in a characteristic wavelength range having a peak wavelength of less than about 300 nm.

21. The device of claim 20, wherein a light output of the device is higher than a light output of a substantially similar device without a dopant front loaded tunnel barrier layer.

22. The device of claim 20, wherein the light emitting device is one of a light emitting diode, a laser diode, and a superluminescent diode.

* * * * *